(12) United States Patent
Cheng et al.

(10) Patent No.: US 11,355,588 B2
(45) Date of Patent: Jun. 7, 2022

(54) STRAINED AND UNSTRAINED SEMICONDUCTOR DEVICE FEATURES FORMED ON THE SAME SUBSTRATE

(71) Applicant: International Business Machines Corporation, Armonk, NY (US)

(72) Inventors: Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 201 days.

(21) Appl. No.: 16/812,763

(22) Filed: Mar. 9, 2020

(65) Prior Publication Data

US 2020/0212181 A1 Jul. 2, 2020

Related U.S. Application Data

(62) Division of application No. 15/584,159, filed on May 2, 2017, now Pat. No. 10,644,108, which is a division
(Continued)

(51) Int. Cl.
*H01L 29/10* (2006.01)
*H01L 29/06* (2006.01)
(Continued)

(52) U.S. Cl.
CPC .. *H01L 29/1054* (2013.01); *H01L 21/823431* (2013.01); *H01L 21/823807* (2013.01);
(Continued)

(58) Field of Classification Search
CPC .............. H01L 29/1054; H01L 21/823468
See application file for complete search history.

(56) References Cited

U.S. PATENT DOCUMENTS

| 7,098,057 B2 | 8/2006 | Chu et al. |
| 7,198,995 B2 | 4/2007 | Chidambarrao et al. |
| (Continued) | | |

FOREIGN PATENT DOCUMENTS

| EP | 2682983 A1 | 1/2014 |
| TW | I527242 B | 3/2016 |

OTHER PUBLICATIONS

Disclosed Anonymously, "Method and System for Fabricating a High-k/metal Gate finFET CMOS by Simultaneously Forming Si-nFET and SiGe-pFET on a Semiconductor Substrate", IP.com, May 7, 2012, 6 pages, IP.com Electronic Publication, No. IPCOM000217323.
(Continued)

*Primary Examiner* — Moazzam Hossain
(74) *Attorney, Agent, or Firm* — Cantor Colburn LLP; Randall Bluestone

(57) ABSTRACT

Embodiments of the invention are directed to a configuration of semiconductor devices having a substrate and a first feature formed on the substrate, wherein the first feature includes a first preserve region having compressive strain that extends throughout the first preserve region, and wherein the first feature further includes a cut region that includes a converted dielectric. The converted dielectric is a dielectric material that has been converted to the dielectric from another material.

20 Claims, 14 Drawing Sheets

Related U.S. Application Data of application No. 15/196,298, filed on Jun. 29, 2016, now Pat. No. 9,917,154.

(51) Int. Cl.

| | | |
|---|---|---|
| *H01L 27/12* | (2006.01) | |
| *H01L 27/092* | (2006.01) | |
| *H01L 29/161* | (2006.01) | |
| *H01L 29/78* | (2006.01) | |
| *H01L 21/8238* | (2006.01) | |
| *H01L 29/16* | (2006.01) | |
| *H01L 21/8234* | (2006.01) | |
| *H01L 21/84* | (2006.01) | |
| *H01L 29/417* | (2006.01) | |
| *H01L 29/66* | (2006.01) | |
| *H01L 29/737* | (2006.01) | |

(52) U.S. Cl.
CPC .............. *H01L 21/823821* (2013.01); *H01L 21/823878* (2013.01); *H01L 21/845* (2013.01); *H01L 27/0924* (2013.01); *H01L 27/1211* (2013.01); *H01L 29/0653* (2013.01); *H01L 29/16* (2013.01); *H01L 29/161* (2013.01); *H01L 29/41791* (2013.01); *H01L 29/66795* (2013.01); *H01L 29/7378* (2013.01); *H01L 29/785* (2013.01); *H01L 2029/7858* (2013.01)

(56) References Cited

U.S. PATENT DOCUMENTS

| | | |
|---|---|---|
| 7,384,830 B2 | 6/2008 | Cohen |
| 8,169,025 B2 | 5/2012 | Bedell et al. |
| 8,841,178 B1 | 9/2014 | Basker et al. |
| 8,883,578 B2 | 11/2014 | Basker et al. |
| 8,927,363 B2 | 1/2015 | Cheng et al. |
| 9,224,736 B1 | 12/2015 | Ching et al. |
| 9,276,013 B1 | 3/2016 | Doris et al. |
| 9,281,381 B2 | 3/2016 | Basker et al. |
| 9,917,154 B2 | 3/2018 | Cheng et al. |
| 2002/0168802 A1 | 11/2002 | Hsu et al. |
| 2005/0136584 A1 | 6/2005 | Boyanov et al. |
| 2008/0001171 A1 | 1/2008 | Tezuka et al. |
| 2011/0175166 A1 | 7/2011 | Bedell et al. |
| 2011/0210393 A1 | 9/2011 | Chen et al. |
| 2013/0175584 A1 | 7/2013 | Ho et al. |
| 2013/0187237 A1 | 7/2013 | Yu et al. |
| 2014/0027860 A1 | 1/2014 | Glass et al. |
| 2014/0103452 A1 | 4/2014 | Chang et al. |
| 2016/0300948 A1 | 10/2016 | Yang et al. |
| 2016/0351701 A1 | 12/2016 | Cea et al. |
| 2016/0365344 A1 | 12/2016 | Feng et al. |
| 2016/0380056 A1 | 12/2016 | Yeo et al. |
| 2017/0092766 A1 | 3/2017 | Kim et al. |
| 2017/0133377 A1 | 5/2017 | Glass et al. |
| 2017/0154990 A1 | 6/2017 | Sung et al. |
| 2017/0170175 A1* | 6/2017 | Chang ............ H01L 21/823462 |
| 2017/0179275 A1 | 6/2017 | Li |
| 2018/0005892 A1 | 1/2018 | Cheng et al. |

OTHER PUBLICATIONS

List of IBM Patents or Patent Applications Treated as Related; Date Filed: Mar. 9, 2020, 2 pages.

* cited by examiner

STRAINED AND UNSTRAINED SEMICONDUCTOR DEVICE FEATURES FORMED ON THE SAME SUBSTRATE

DOMESTIC PRIORITY

This application is a divisional of U.S. application Ser. No. 15/584,159, titled "STRAINED AND UNSTRAINED SEMICONDUCTOR DEVICE FEATURES FORMED ON THE SAME SUBSTRATE" filed May 2, 2017, which is a divisional of U.S. application Ser. No. 15/196,298, now U.S. Pat. No. 9,917,154, titled "STRAINED AND UNSTRAINED SEMICONDUCTOR DEVICE FEATURES FORMED ON THE SAME SUBSTRATE" filed Jun. 29, 2016, the contents of which are incorporated by reference herein in its entirety.

BACKGROUND

Embodiments of the present invention relates in general to semiconductor devices for use in integrated circuits (ICs). More specifically, embodiments of the present invention relates to improved fabrication methodologies and resulting structures for semiconductor device configurations (e.g., fin-type field effect transistors (FinFETs)) having strained and unstrained semiconductor device features formed on the same substrate.

Transistors are fundamental device elements of modern digital processors and memory devices. There are a variety of transistor types and designs that may be used for different applications, including, for example, bipolar junction transistors (BJT), junction field-effect transistors (JFET), and metal-oxide-semiconductor field-effect transistors (MOSFET). One type of transistor that has emerged within the MOSFET family of transistors, and which shows promise for scaling to ultra-high density and nanometer-scale channel lengths, is a so-called FinFET device. The channel of a FinFET is formed in a three-dimensional fin that may extend from a surface of a substrate, and the transistor's channel can be formed on three surfaces of the fin. Accordingly, FinFETs can exhibit a high current switching capability for a given surface area occupied on substrate.

The use of silicon germanium in semiconductor devices such as FinFETs provides desirable device characteristics, including the introduction of strain at the interface between the silicon germanium of the active device and the underlying semiconductor substrate. Accordingly, it is desirable to provide compressive strain in some features of a semiconductor device, including, for example, the fin of a fin-based semiconductor device such as a FinFET.

SUMMARY

Embodiments are directed to a method of forming a feature of a semiconductor device. The method includes forming the feature from a semiconductor material having compressive strain that extends throughout a cut region of the feature and throughout a preserve region of the feature. The method further includes converting the cut region of the feature to a dielectric.

Embodiments are further directed to a method of forming features of semiconductor devices. The method includes forming a first feature on a substrate, wherein the first feature comprises a first semiconductor material having compressive strain that extends throughout a first cut region of the first feature and throughout a first preserve region of the first feature. The method further includes forming a second feature on the substrate, wherein the second feature comprises a second semiconductor material having substantially no compressive strain extending throughout a second cut region of the second feature and throughout a second preserve region of the second feature. The method further includes converting the first cut region of the feature to a dielectric, introducing compressive strain into the second cut region, and removing the second cut region from the second feature.

Embodiments are further directed to a configuration of semiconductor devices having a substrate and a first feature formed on the substrate, wherein the first feature includes a first preserve region having compressive strain that extends throughout the first preserve region, and wherein the first feature further includes a cut region comprising a dielectric.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
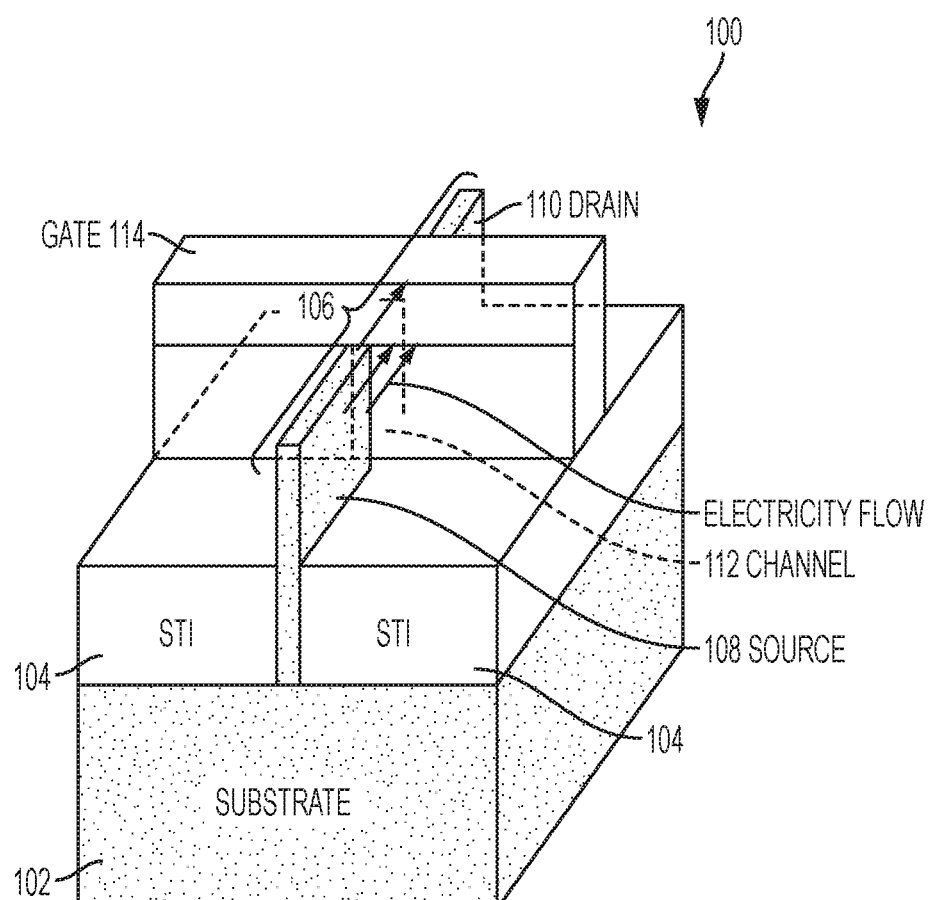
FIG. 1 depicts a three-dimensional view of an exemplary configuration of a known FinFET device.

It is understood in advance that, although this disclosure includes a detailed description of p-type and n-type FinFET devices having silicon germanium and silicon fins, implementation of the teachings recited herein are not limited to a particular type of FET structure. Rather, embodiments of the present invention are capable of being implemented in conjunction with any other type of fin-based transistor device, now known or later developed.

Various embodiments of the present invention are described herein with reference to the related drawings. Alternative embodiments may be devised without departing from the scope of this invention. It is noted that various connections and positional relationships (e.g., over, below, adjacent, etc.) are set forth between elements in the following description and in the drawings. These connections and/or positional relationships, unless specified otherwise, may be direct or indirect, and the present invention is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present invention will now be provided. Although specific fabrication operations used in implementing one or more embodiments of the present invention may be individually known, the disclosed combination of operations and/or resulting structures of the present invention are unique. Thus, the unique combination of the operations described according to embodiments of the present invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Semiconductor devices are typically formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body)

region. Disposed above the body region is a gate electrode. The gate electrode and the body are spaced apart by a gate dielectric layer.

One particularly advantageous type of MOSFET is known generally as a fin-type field effect transistor (FinFET), an example of which is shown in FIG. 1 as a three-dimensional view of a FinFET 100. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 may be silicon, STI 104 may be an oxide (e.g., Silicon oxide) and fin 106 may be silicon that has been enriched to a desired concentration level of germanium. Gate 114 controls the source to drain current flow (labeled ELECTRICITY FLOW in FIG. 1).

In contrast to planar MOSFETs, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

The use of silicon germanium in semiconductor devices provides desirable device characteristics, including the introduction of strain at the interface between the silicon germanium of the active device and the underlying semiconductor substrate. In general, a strained semiconductor's atoms are stretched beyond their normal inter-atomic distances. As the atoms in the silicon align with the atoms of the silicon germanium (which are arranged a little farther apart, with respect to those of a bulk silicon crystal), the links between the silicon germanium atoms become stretched, thereby leading to strained silicon germanium. Moving atoms farther apart reduces the atomic forces that interfere with the movement of electrons through the silicon germanium, which results in better mobility, better chip performance and lower energy consumption. The faster moving electrons in strained silicon germanium allow faster switching in transistors having strained silicon germanium channel regions.

The compressive strain (typically expressed as a percentage) introduced by using silicon germanium in the active region of a semiconductor device is based on the concentration of germanium introduced into the silicon. For example, a silicon germanium feature (e.g., a fin) having a 25% concentration of germanium can exhibit a nominal compressive strain of 0.01 (or 1%) with a +/−2% variation. It is desirable to substantially maintain the compressive strain within a predetermined variation throughout the volume of the feature.

However, when silicon germanium fins are cut into desired lengths to meet device and/or IC design requirements, strain relaxes at the ends of the fin ends. For example, in a silicon germanium feature (e.g., a fin) having a 25% concentration of germanium and a nominal compressive strain of 0.01 (or 1%) with a +/−2% variation throughout its uncut volume, when the feature is cut to meet design requirement, the compressive strain at the cut ends of the feature is relaxed outside the +/−2% variation. The loss of compressive strain at the ends of the silicon germanium feature causes device degradation and variation. Accordingly, there is a need to fabricate strained semiconductor device features having the desired dimensions but without the relaxation or removal of compressive strain from the ends of the feature.

Turning now to an overview of the present invention, one or more embodiments provide a feature fabrication methodology that allows for the fabrication of strained semiconductor device features having the desired dimensions but without the relaxation or removal of compressive strain from the ends of the feature. In one or more embodiments, the feature is a fin structure, and the methodology begins by forming the initial fin structure on a substrate. In one or more embodiments, the initial fin structure is a strained fin formed from silicon germanium having s predetermined percentage of compressive strain with a predetermined +/− variation in the compressive strain level throughout the initial fin structure. Cut regions and preserve regions are selected on the initial fin structure. In general, the preserve region(s) are the portions of the initial fin structure that will provide the fin dimensions required by the semiconductor and/or IC design, and the cut regions are the portions of the initial fin structure that are extraneous beyond the fin dimensions required by the semiconductor and/or IC design. In downstream processes, the silicon germanium preserve regions of the fins will be used to form p-type FETs.

In the disclosed methodology, instead of removing the cut region, which would result in a relaxation and/or a removal of compressive strain at the cut end of the preserve region, one or more embodiments of the present invention convert the strained silicon germanium fin material in the cut region to a dielectric. In one or more embodiments, the silicon germanium fin material in the cut region is converted to a dielectric by applying an oxidation (e.g., a thermal oxidation) to the cut regions to convert the cut regions to an oxide. The resulting structure is the preserve region anchored by an oxide region, wherein the oxide region the strained cut region prior to oxidation. The strained preserve region is never physically cut, so there is no compressive strain relaxation at the end of the preserve region. Additionally, oxidation induced volume expansion in the oxide region, which is anchored to the preserve region, further enhances compressive strain in the strained preserve region.

In one or more embodiments of the present invention, multiple initial fin structures are formed on the substrate, and some of the initial fin structures are silicon having substantially no compressive strain. In downstream processes, the silicon fins will be used to form n-type FETs. When the above described methodology is applied to the silicon initial fin structures, the oxide regions that anchor the silicon fin preserve region introduce compressive strain, which is undesirable for n-type FETs. Embodiments of the present invention remove the oxide region from the silicon preserve region, thereby removing compressive strain from the silicon preserve region. Accordingly, embodiments of the present invention enable the fabrication of both strained FET structures (e.g., silicon germanium p-type FETs) and non-strained FET structures (e.g., n-type FETs) on the same substrate.

Figure 2:
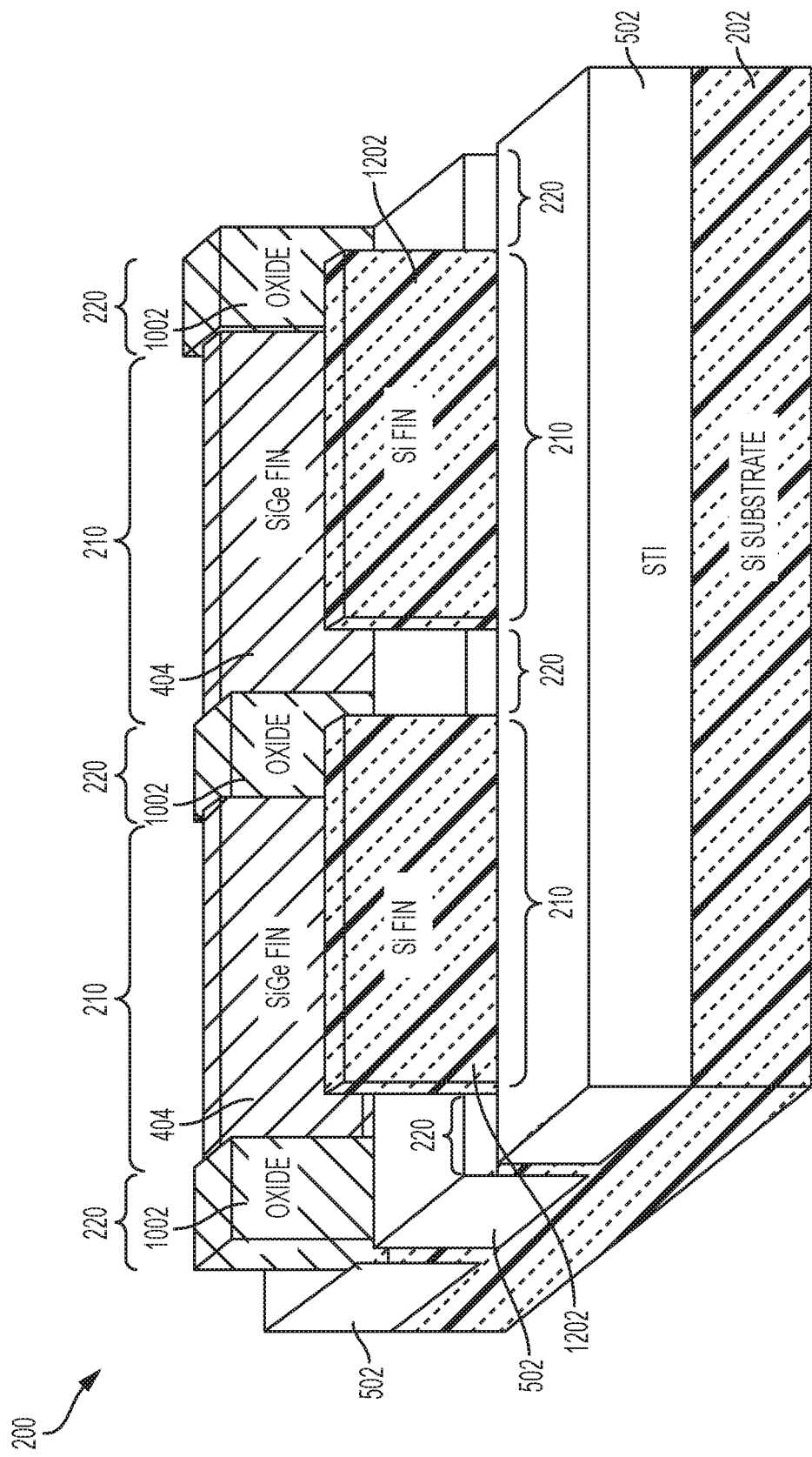
FIG. 2 depicts a three-dimensional view of a strained and unstrained fin configuration that results from employing the teachings of the present invention.

Turning now to a more detailed description of the present invention, FIG. 2 depicts a semiconductor device structure 200 having strained and unstrained features formed on the same substrate in accordance with one or more embodiments. In the embodiment shown in FIG. 2, the feature is a fin that will ultimately form an active region (e.g., a channel, a source, a drain, etc.) of a p-type or an n-type FET, and the fins are either strained fins formed from silicon germanium, or unstrained fins formed from silicon. Structure 200 includes a substrate 202, shallow trench isolation regions (STIs) 502, silicon fins 1202, silicon germanium fins 404, and oxide anchors/blocks 1002, configured and arranged as shown. The fins 404, 1202 define preserve regions 210 of structure 200, and the oxide anchors/blocks 1002 define cut regions 220 of structure 200. In the cut regions 220 adjacent to the unstrained silicon fins 1202, the oxide anchors 1002 have been removed.

Figure 13:
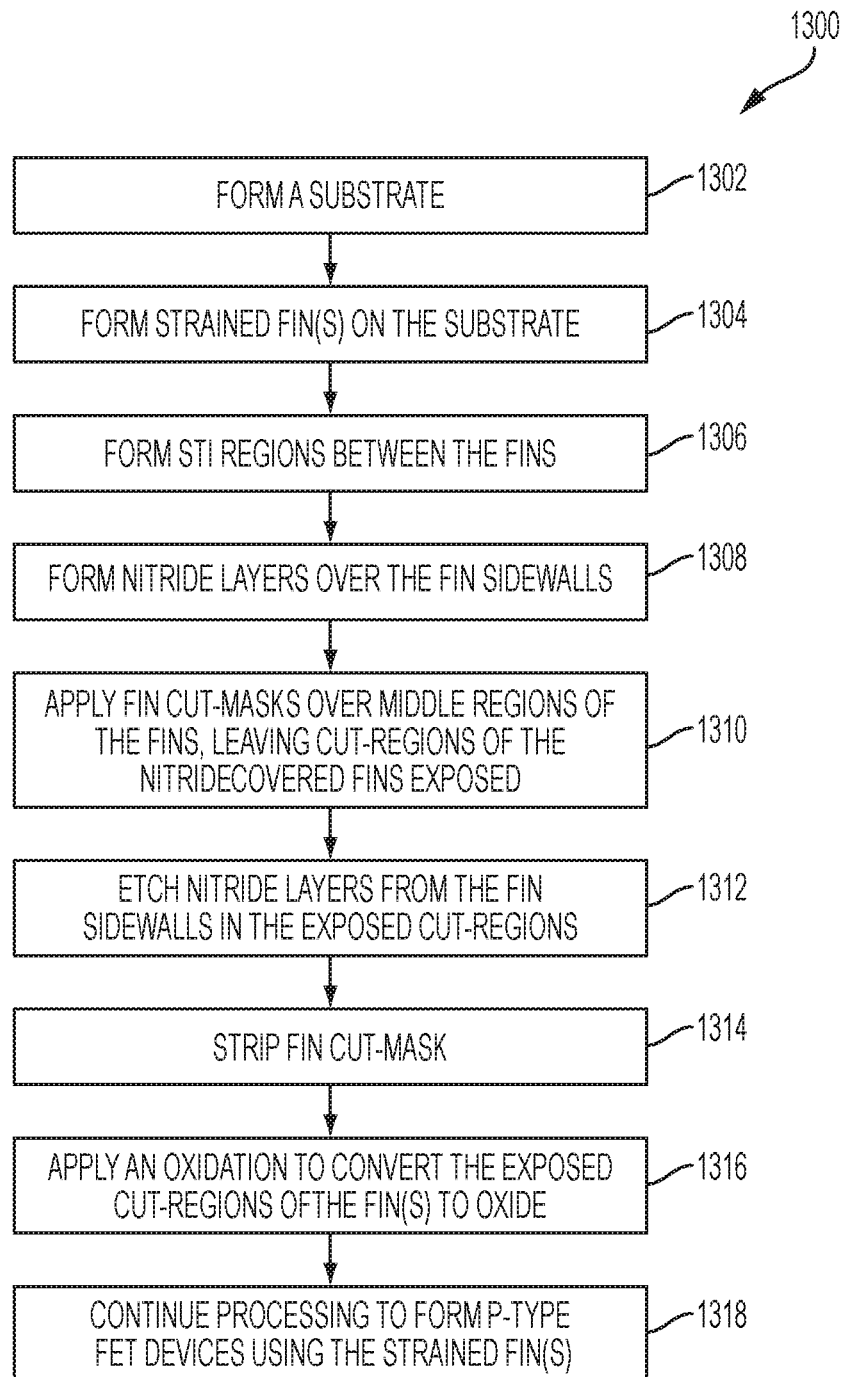
FIG. 13 is a flow diagram illustrating a methodology according to one or more embodiments.
Figure 14:
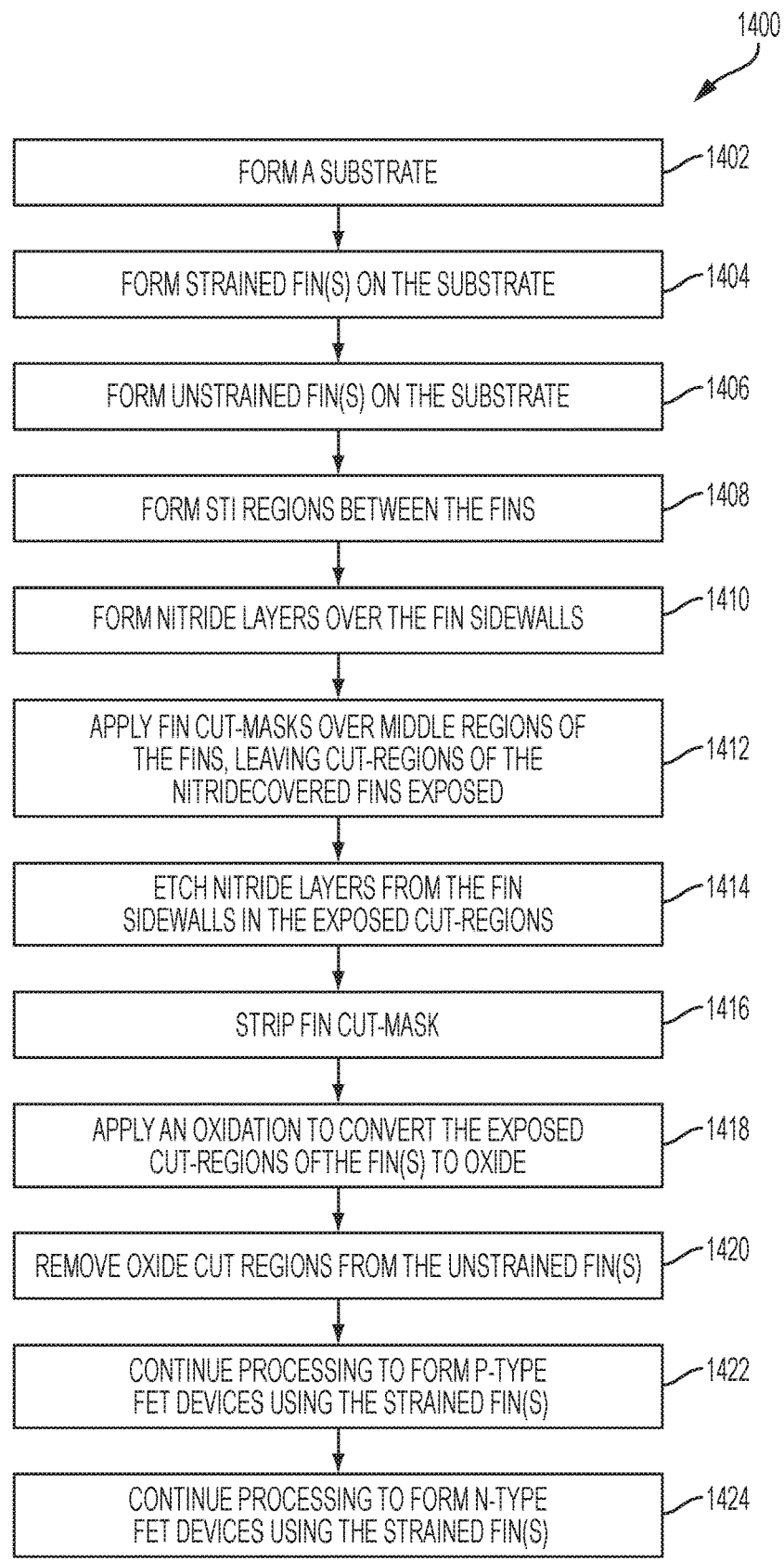
FIG. 14 is a flow diagram illustrating a methodology according to one or more embodiments.

A methodology for fabricating structure 200 according to one more embodiments of the present invention will now be described with reference to FIGS. 3-14. FIGS. 3-12 depict three-dimensional views of a semiconductor structure 200A after various fabrication stages in accordance with one or more embodiments. FIG. 13 depicts a flow diagram illustrating a fabrication methodology 1300 according to one or more embodiments. FIG. 14 depicts a flow diagram illustrating another fabrication methodology 1300 according to one or more embodiments. A description of exemplary fabrication methodologies for forming structure 200 shown in FIG. 2 according to one or more embodiment of the present invention will now be provided with reference to the fabrication stages shown in FIGS. 3-13, as well as methodologies 1300, 1400 shown in FIGS. 13 and 14.

Figure 3:
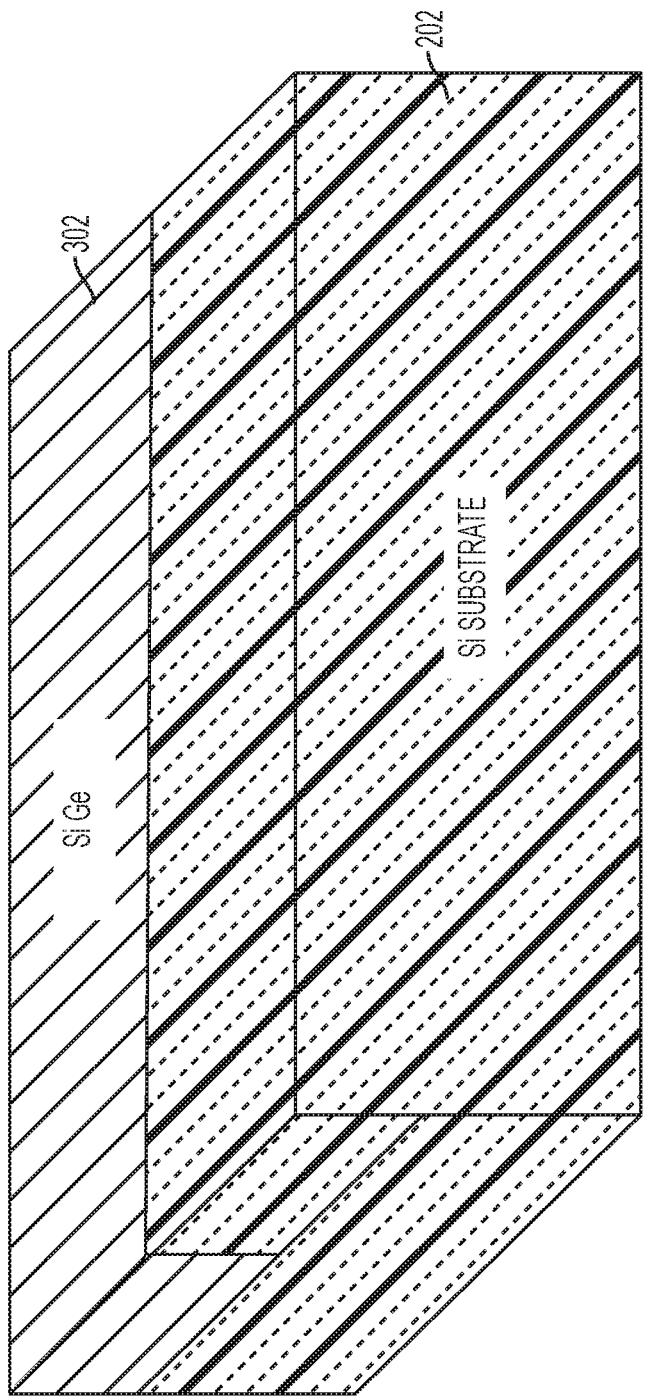
FIG. 3 depicts a three-dimensional view of an initial fabrication stage for a fin configuration according to one or more embodiments.

As shown in FIG. 3, in an initial fabrication stage of structure 200A according to one or more embodiments, a substrate 202 is formed using known semiconductor fabrication techniques (block 1302, block 1402). The portion(s) of substrate 202 on which the unstrained silicon fins will be formed are masked (not shown), and silicon germanium 302 is epitaxially grown on the unmasked portion(s) of the silicon substrate 202.

In FIGS. 4-11, for ease of illustration, only the strained silicon germanium portions of the structure 200A fins are shown. However, the fabrication operations illustrated in FIGS. 4-11 are applied simultaneously to the unstrained silicon portions of the structure 200A.

Figure 4:
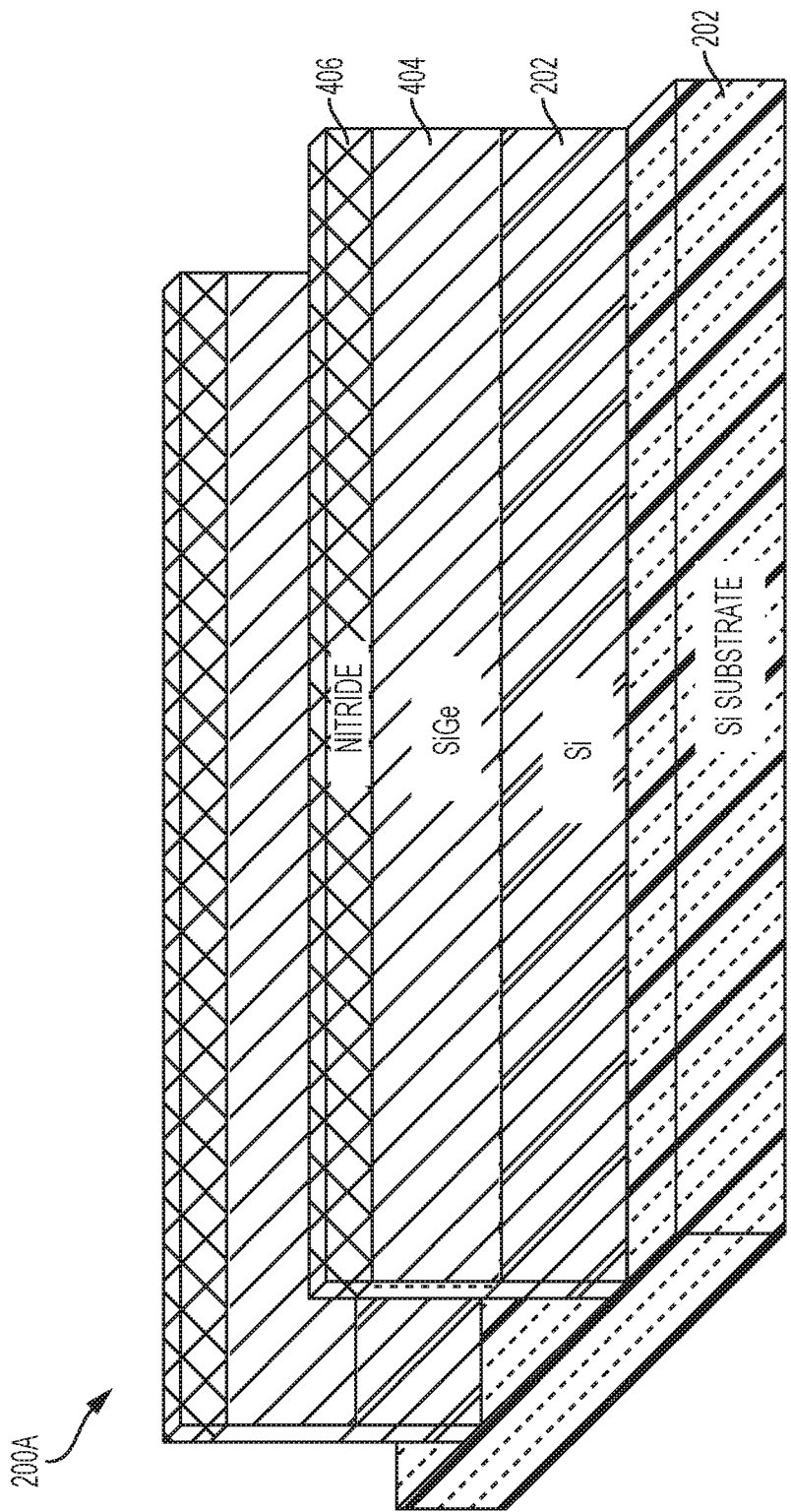
FIG. 4 depicts a three-dimensional view of another intermediate fabrication stage for a fin configuration according to one or more embodiments.

As shown in FIG. 4, a hard mask layer (not shown) is formed over the strained silicon germanium 302. The hard mask layer is patterned, and then hard masks 406 and strained silicon germanium fins 404 are formed by applying an anisotropic etch process (block 1304, block 1404). Because there is no stop layer on substrate 202, the etch process is time based. Hardmasks 406 may be a silicon nitride material (e.g., $Si_3Ni_4$).

Figure 5:
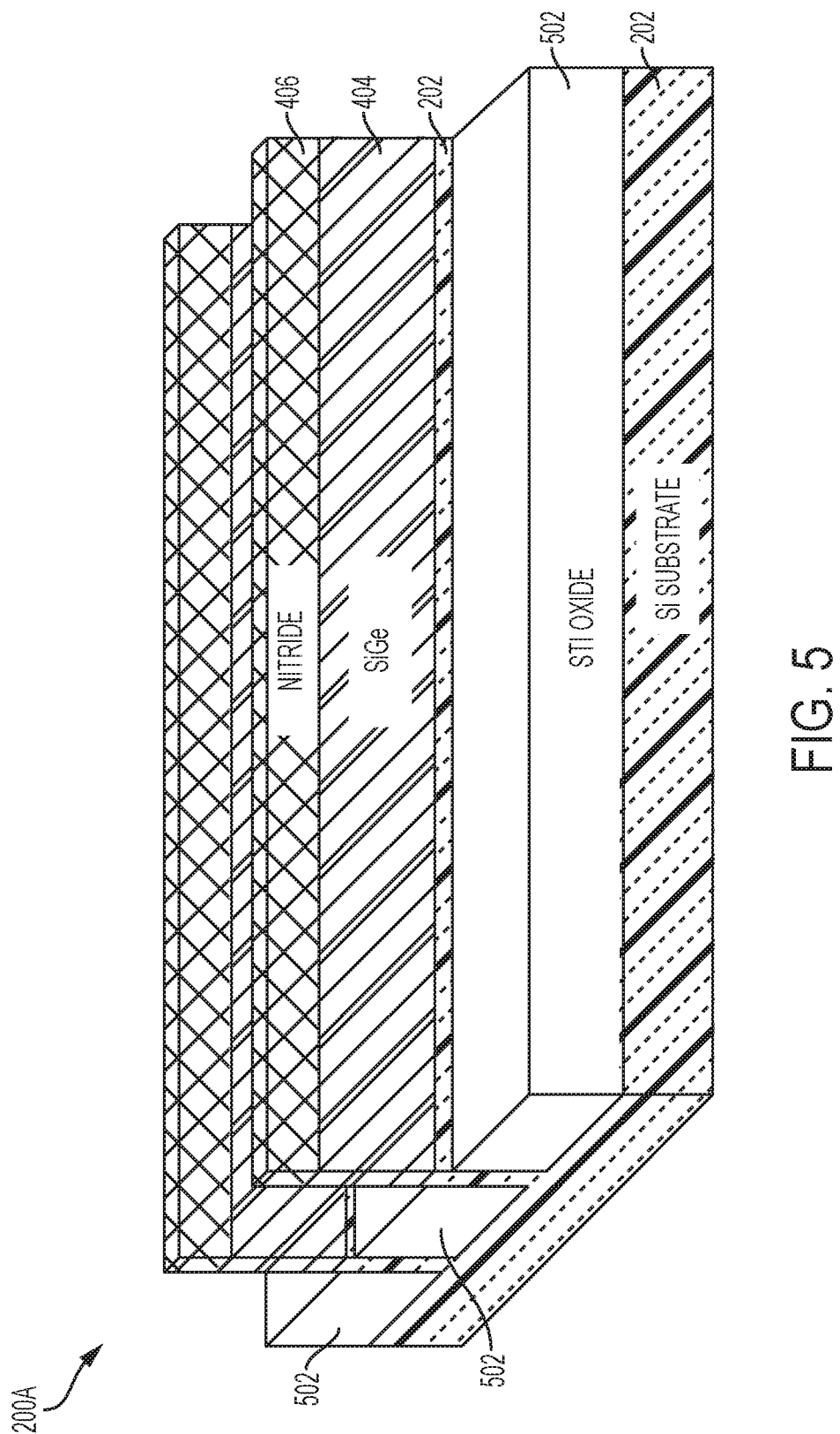
FIG. 5 depicts a three-dimensional view of another intermediate fabrication stage for a fin configuration according to one or more embodiments.
Figure 6:
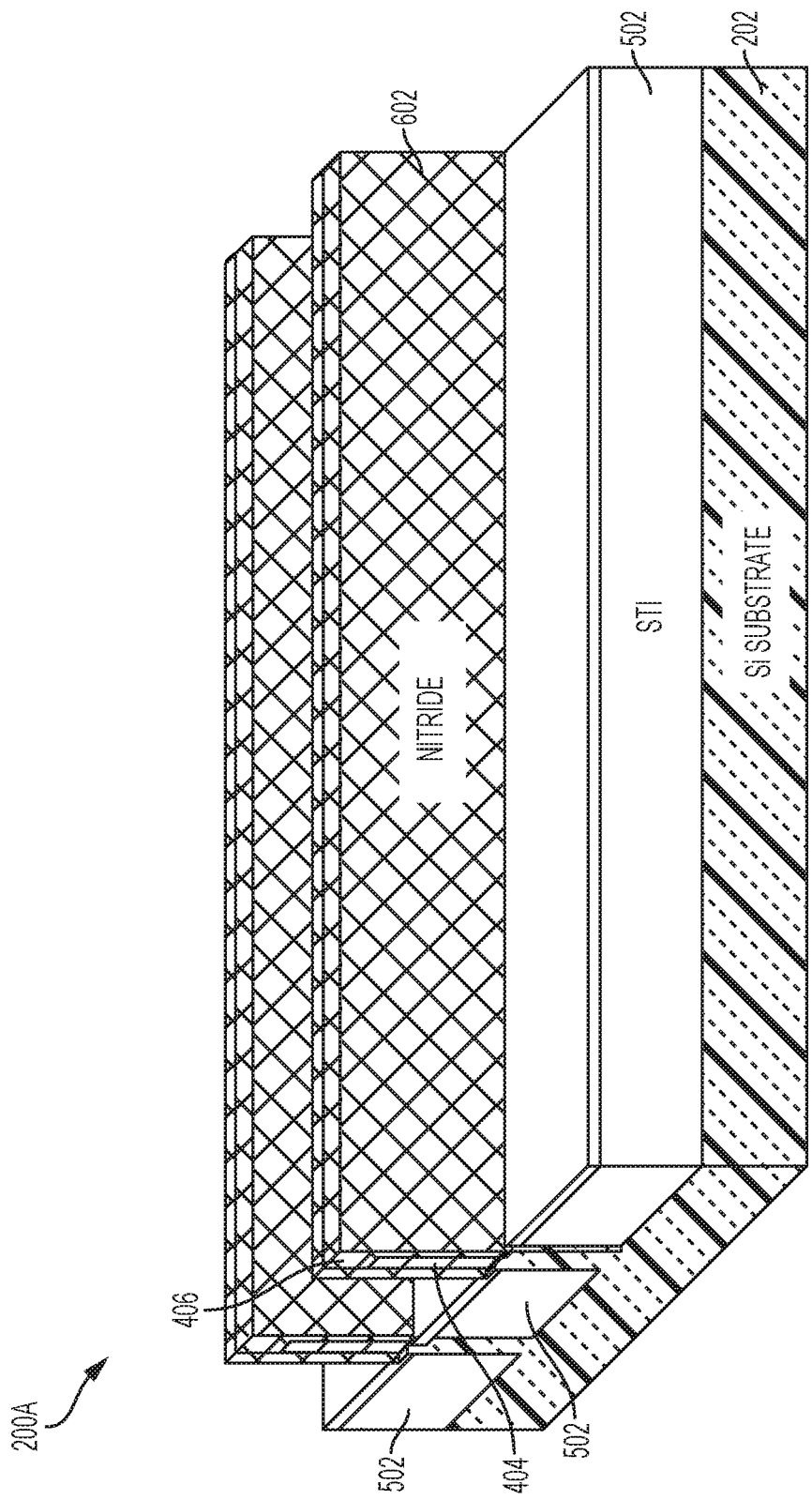
FIG. 6 depicts a three-dimensional view of another intermediate fabrication stage for a fin configuration according to one or more embodiments.

In FIG. 5, a local oxide (e.g., silicon oxide) is deposited between fins 402 (including the lower portion of the fins formed from the silicon substrate 202) and over substrate 202. The local oxide is polished and recessed back to form STI regions 506, and to expose upper portions of the strained silicon germanium fins 404 (block 1306, block 1408). In FIG. 6, a nitride layer 602 is applied over the sidewalls of fins 404 and STI 502 (block 1308, block 1410).

Figure 7:
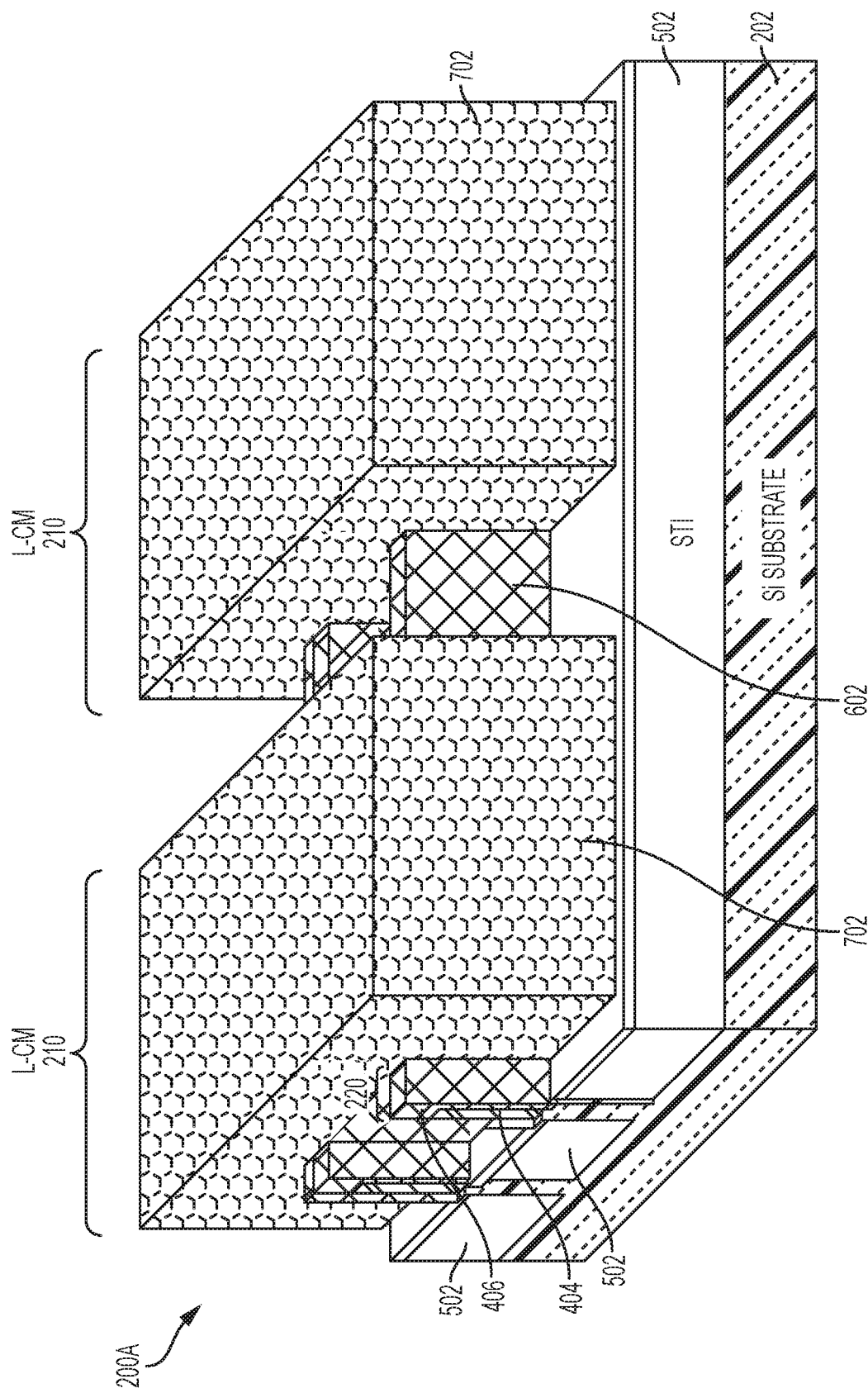
FIG. 7 depicts a three-dimensional view of another intermediate fabrication stage for a fin configuration according to one or more embodiments.
Figure 8:
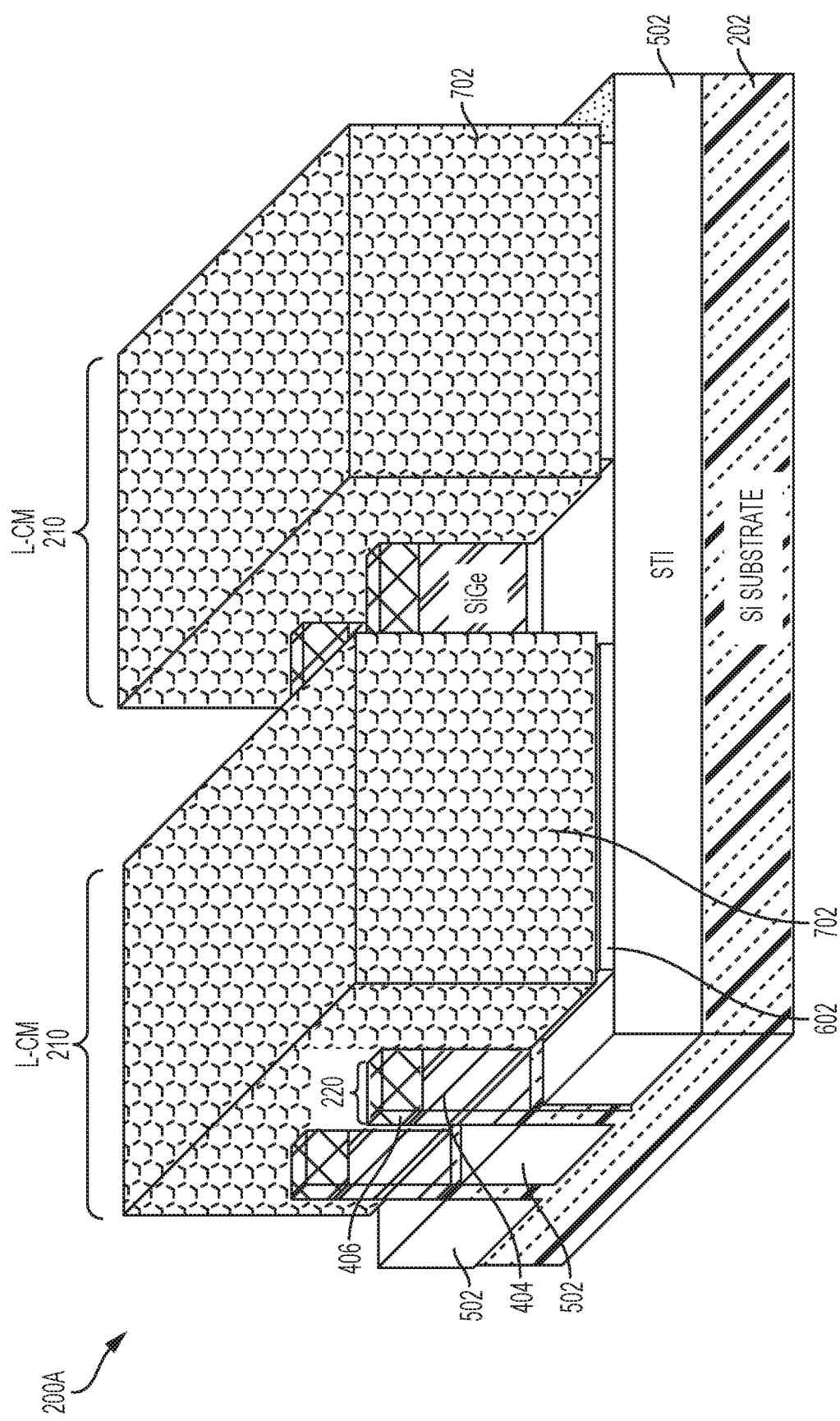
FIG. 8 depicts a three-dimensional view of another intermediate fabrication stage for a fin configuration according to one or more embodiments.
Figure 9:
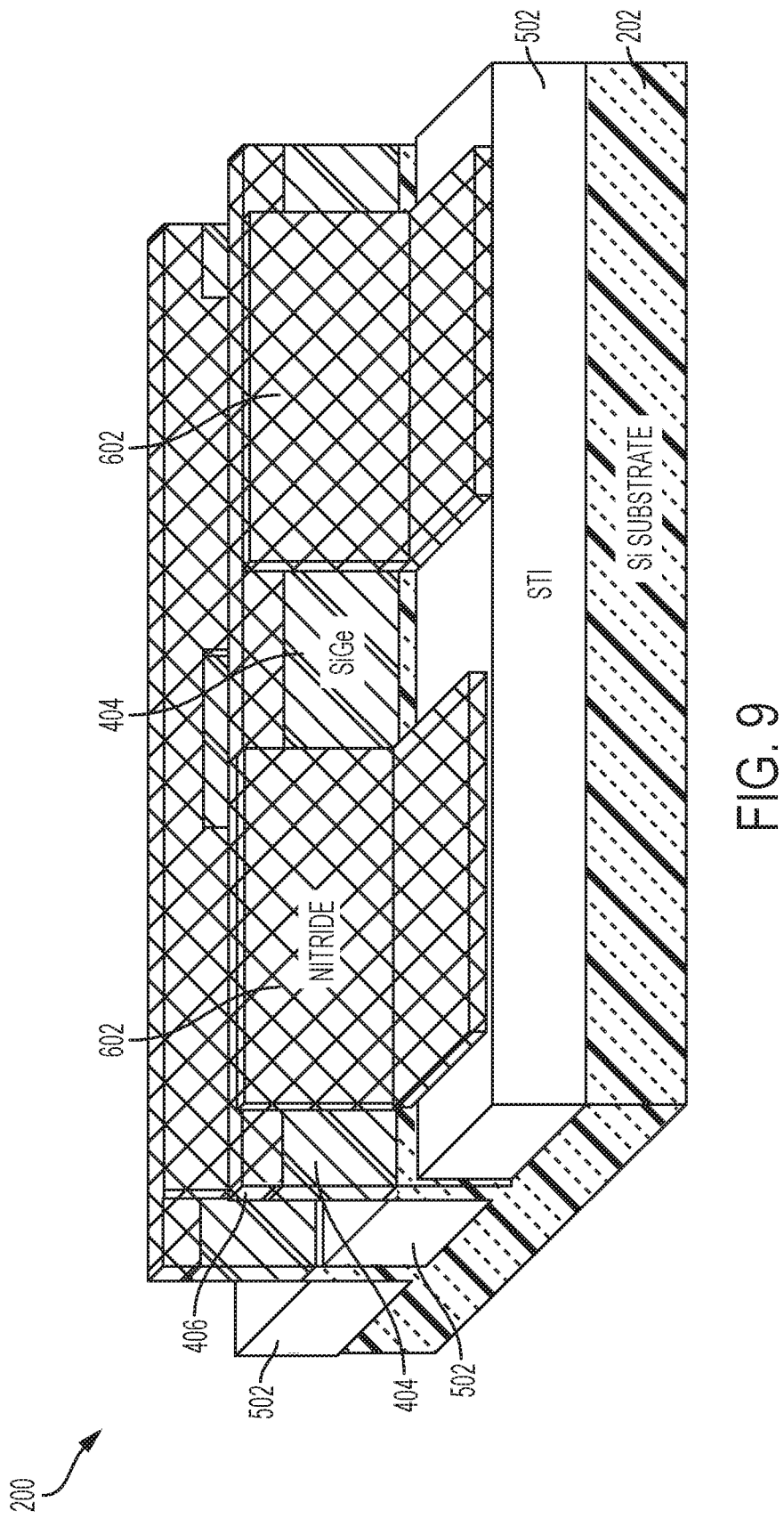
FIG. 9 depicts a three-dimensional view of another intermediate fabrication stage for a fin configuration according to one or more embodiments.

In FIG. 7, fin cut masks 702 are applied over nitride layer 602 and hardmasks 406 (block 1310, block 1412). Each cut mask 702 includes a dimension L-CM, which defines the preserve region 210 of the fins 404. The dimension L-CM is selected to match a selected length of the fin 404. The areas of the hardmasks 406 and fins 404 not covered by fin cut masks 702 define the cut regions 220. In FIG. 8, nitride layer 602 is etched in the cut regions 220 to expose the portions of the strained silicon germanium fins 440 that are in the cut regions 220 (block 1312, block 1414). In FIG. 9, the fin cut mask 702 is stripped (block 1314, block 1414).

Figure 10:
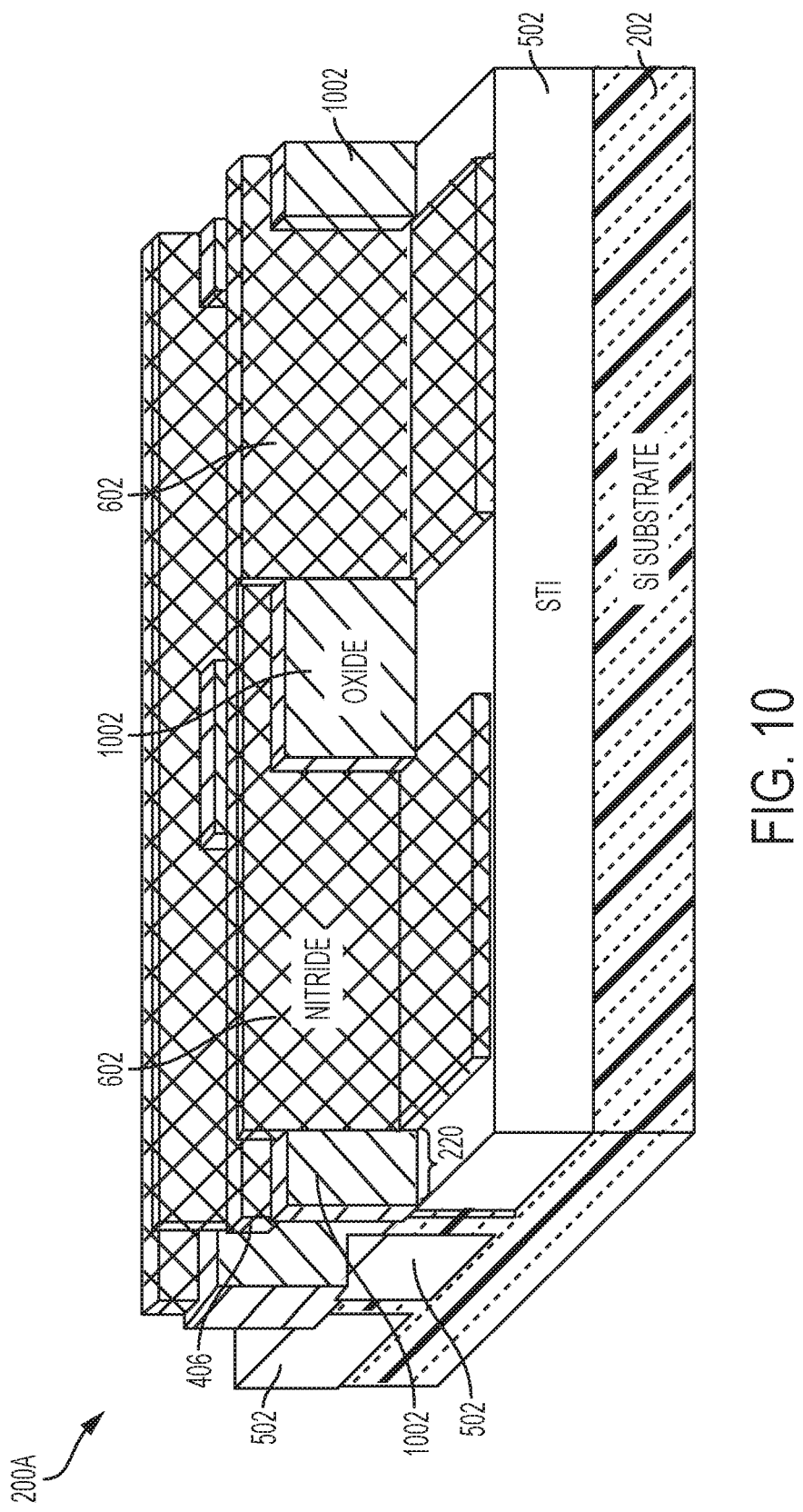
FIG. 10 depicts a three-dimensional view of another intermediate fabrication stage for a fin configuration according to one or more embodiments.
Figure 11:
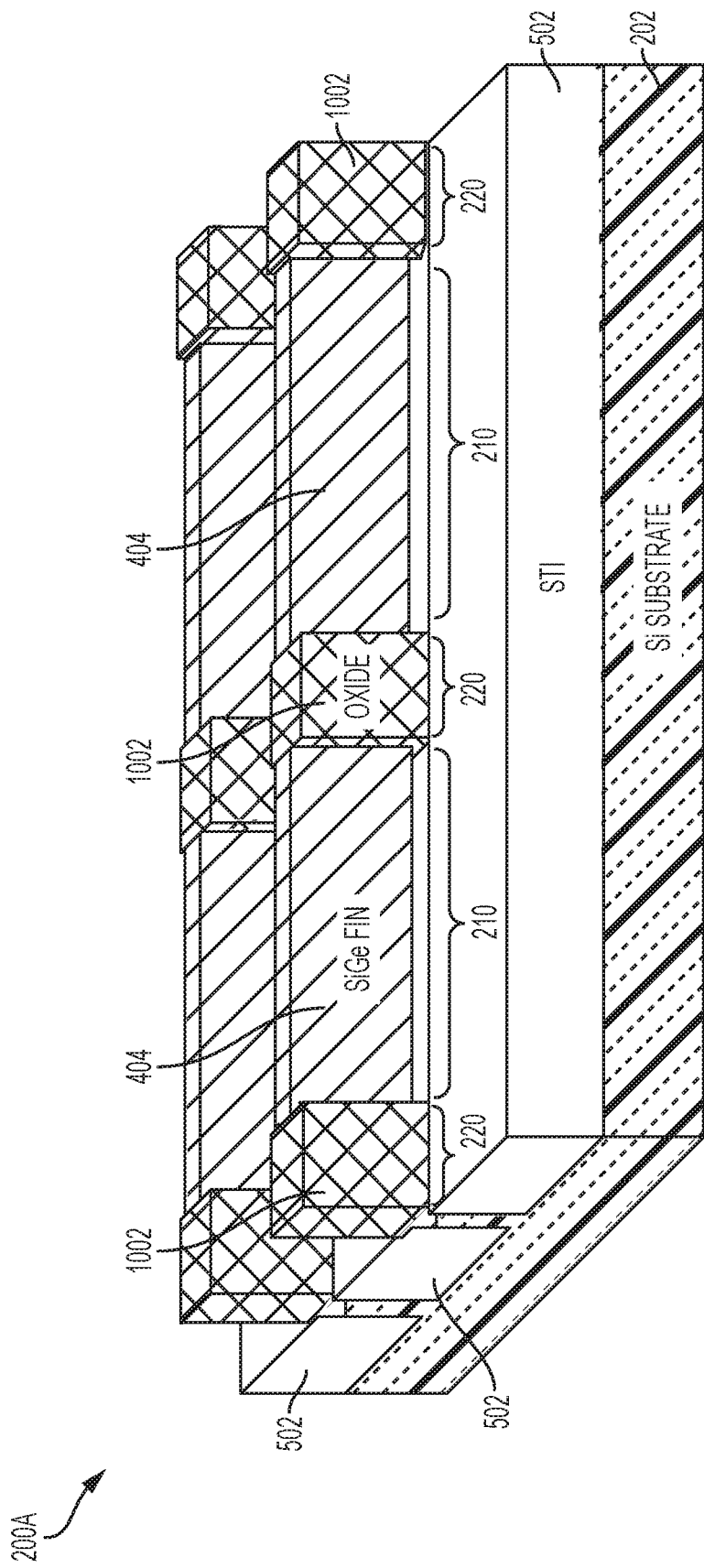
FIG. 11 depicts a three-dimensional view of another intermediate fabrication stage for a fin configuration according to one or more embodiments.

In FIG. 10, an oxidation (e.g., a thermal oxidation) is performed to convert the portions of the strained silicon germanium fins 404 that are in the cut regions 210 into an oxide, thereby forming oxide anchors/blocks 1002 (block 1316, block 1418). In FIG. 11, the nitride layer 602 is stripped. Because the strained silicon germanium fins 404 are never cut to arrive at the desired preserve region 210 dimensions, there is no strain relaxation in the ends of the portions of the strained silicon germanium fins 404 that are in the preserve regions 210. For example, if the strained silicon germanium fins 404, prior to the oxidation shown in FIG. 10, have a 25% concentration of germanium, the strained silicon germanium fins 404 can exhibit a nominal compressive strain of 0.01 (or 1%) with a +/−2% variation. Using the fabrication methodologies of embodiments of the present invention to form the preserve region 210 subsequent to the oxidation shown in FIG. 10, there is no relaxation in the nominal compressive strain of 0.01 (or 1%) with a +/−2% variation. In fact, due to oxidation induced volume expansion of the oxide anchors/blocks 1002, compressive strain in the portions of the silicon germanium fins 404 that are in the preserve region 210 is enhanced above the nominal compressive strain that was present prior to formation of the oxide blocks/anchors 1002.

Figure 12:
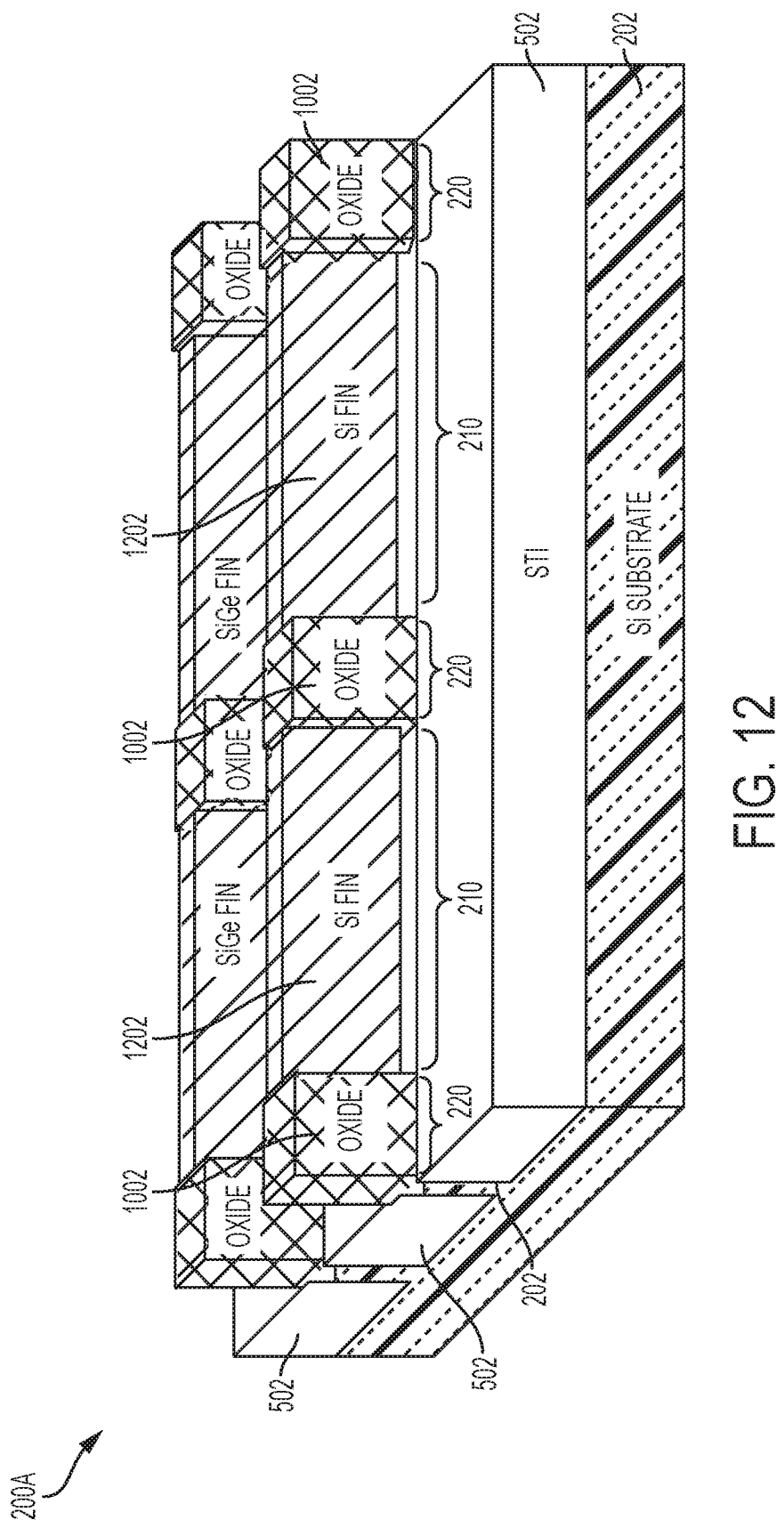
FIG. 12 depicts a cross-sectional view of a final fabrication stage for a fin configuration according to one or more embodiments.

FIG. 12 depicts the structure 200A showing the strained fins 404 and the unstrained fins and the unstrained fins 1202. Because, the above-described fabrication processes where applied simultaneously to the strained fins 404 and the unstrained fins 1202 (block 1406), oxide blocks/anchors 1002 also anchor the ends of the unstrained fins 1202. For the unstrained fins 1202, formation of the oxide blocks/anchors 1002 in the cut regions 220 introduces compressive strain to the previously unstrained portions of the fins 1202 that are in the preserve region 210. As previously noted, the unstrained fins will be used to form n-type FET devices. The compressive strain due to oxidation is undesired for silicon n-type FET devices. Accordingly, the oxide blocks/anchors 1002 at the ends of the silicon fins 1202 are removed, which removes the compressive strain introduced to the silicon fins 1202 in the preserve regions 210 by the oxide blocks/anchors 1002 (block 1420). The oxide blocks/anchors 1002 that are adjacent the silicon fins 1202 may be removed using any suitable technique, including, for example, the use of an appropriately patterned block mask (not shown) to protect the SiGe fins followed by an etch process.

After removal of the oxide blocks/anchors 1002 that are adjacent to the silicon fins 1202, structure 200A is now the same as structure 200 in FIG. 2. In structure 200, both the strained silicon germanium fins 404 and the unstrained silicon fins 1202 are formed in the same substrate 202. The strained silicon germanium fins 404 have oxide anchors/blocks 1002 at the fin ends to maintain and enhance compressive strain in the portions of the strained silicon germanium fins 404 that are located in the preserve regions 210. The unstrained silicon fins 1202 have no oxide at the fin ends to avoid compressive strain in the silicon fins 1202. Structure 200 may now be further processed using known fabrication techniques to form p-type FET devices (e.g., p-type FinFETs) from the strained silicon germanium fins 404 in the preserve regions 210, and form n-type FET devices (e.g., n-type FinFETs) from the unstrained silicon fins 1202 in the preserve regions 210 (block 1318, block 1422, block 1424).

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A configuration of semiconductor devices comprising:
   a substrate; and
   a first feature formed over the substrate;
   wherein the first feature comprises a first preserve region having compressive strain that extends throughout the first preserve region;
   wherein the first feature comprises a first cut region having a converted dielectric extending through an entirety of the first cut region, the converted dielectric comprising a dielectric material that has been converted to the dielectric from another material;
   wherein the compressive strain extending throughout the first preserve region comprises a predetermined percentage of compressive strain.

2. The semiconductor devices of claim 1, wherein the cut region does not reduce the predetermined percentage.

3. The semiconductor devices of claim 1 further comprising a second feature formed over the substrate.

4. The semiconductor devices of claim 3, wherein the second feature comprises a second preserve region having substantially no compressive strain.

5. The semiconductor devices of claim 4, wherein the first feature comprises a first fin.

6. The semiconductor devices of claim 5, wherein the first preserve region comprises a channel region of the first fin.

7. The semiconductor devices of claim 6, wherein the second feature comprises a second fin.

8. The semiconductor devices of claim 4, wherein the first preserve region comprises silicon germanium.

9. The semiconductor devices of claim 8, wherein the dielectric of the first cut region comprises an oxide.

10. The semiconductor devices of claim 9, wherein the second preserve region comprises silicon.

11. A configuration of semiconductor devices comprising:
    a substrate; and
    a first feature formed over the substrate;
    wherein the first feature comprises a first preserve region having compressive strain that extends throughout the first preserve region;
    wherein the first preserve region comprises a first type of semiconductor material;
    wherein the first feature comprises a first cut region having a converted dielectric extending through an entirety of the first cut region, the converted dielectric comprising a dielectric material that has been converted to the dielectric from another material;
    wherein the compressive strain extending throughout the first preserve region comprises a predetermined percentage of compressive strain.

12. The semiconductor devices of claim 11, wherein the cut region does not reduce the predetermined percentage.

13. The semiconductor devices of claim 11 further comprising a second feature formed over the substrate.

14. The semiconductor devices of claim 13, wherein:
    the second feature comprises a second preserve region having substantially no compressive strain; and
    the second preserve region comprises a second type of semiconductor material.

15. The semiconductor devices of claim 14, wherein the first feature comprises a first fin.

16. The semiconductor devices of claim 15, wherein the first preserve region comprises a channel region of the first fin.

17. The semiconductor devices of claim 16, wherein the second feature comprises a second fin.

18. The semiconductor devices of claim 14, wherein the first type of semiconductor material comprises silicon germanium.

19. The semiconductor devices of claim 18, wherein the dielectric of the first cut region comprises an oxide.

20. The semiconductor devices of claim 19, wherein the second type of semiconductor material comprises silicon.

* * * * *